US008754599B2

United States Patent
Sasaki et al.

(10) Patent No.: US 8,754,599 B2
(45) Date of Patent: Jun. 17, 2014

(54) MOTOR CONTROL APPARATUS EQUIPPED WITH DELTA-SIGMA MODULATION AD CONVERTER

(71) Applicant: Fanuc Corporation, Yamanashi (JP)

(72) Inventors: Taku Sasaki, Yamanashi (JP); Yasusuke Iwashita, Yamanashi (JP)

(73) Assignee: Fanuc Corporation, Minamitsuru-Gun, Yamanashi (JP)

( * ) Notice: Subject to any disclaimer, the term of this patent is extended or adjusted under 35 U.S.C. 154(b) by 0 days.

(21) Appl. No.: 13/790,719

(22) Filed: Mar. 8, 2013

(65) Prior Publication Data

US 2013/0278197 A1 Oct. 24, 2013

(30) Foreign Application Priority Data

Apr. 19, 2012 (JP) ................................. 2012-095530

(51) Int. Cl.
*H02P 6/16* (2006.01)

(52) U.S. Cl.
USPC ...... 318/400.04; 318/727; 318/762; 318/800; 318/638; 363/21.18; 363/21.13; 323/283; 323/284

(58) Field of Classification Search
CPC ............. H02P 6/06; H02P 6/182; H02P 6/08; H02P 6/002; H02P 27/06; G04C 3/165; G05B 19/416; G05B 19/408; G05B 5/596; G05B 19/18; G05B 19/16; G11B 2020/00065; G11B 19/28; G11B 20/10037; H02M 2001/0009; H02M 3/157; H02M 7/53873
USPC .................. 318/490, 400.02, 400.04, 400.06, 318/568.18, 400.15, 569, 702, 705, 700, 318/721, 799, 805, 607, 807, 801; 363/21.18, 21.13; 323/283, 284; 341/112, 116
See application file for complete search history.

(56) References Cited

U.S. PATENT DOCUMENTS 7,034,490 B2 * 4/2006 Sawtell et al. ................ 318/569
7,224,135 B1 * 5/2007 Menegoli ................. 318/400.26

(Continued)

FOREIGN PATENT DOCUMENTS

DE 102008040927 A1 4/2009
JP 07015972 A * 1/1995

(Continued)

OTHER PUBLICATIONS

Office Action mailed May 14, 2013 corresponds to Japanese patent application No. 2012-095530.

(Continued)

*Primary Examiner* — Shawki S Ismail
*Assistant Examiner* — Jorge L Carrasquillo
(74) *Attorney, Agent, or Firm* — Lowe Hauptman & Ham, LLP

(57) ABSTRACT

A motor control apparatus includes a power conversion unit which supplies drive power to a motor, a current detection unit which detects the value of a current flowing from the power conversion unit to the motor, a delta-sigma modulation AD converter to which the current value detected by the current detection unit is input as analog data, and which includes a modulator and a plurality of digital low-pass filters and outputs digital data in accordance with the filter characteristics of the respective digital low-pass filters, and a command generating unit which is connected to the digital low-pass filter to be used for motor drive control among the plurality of digital low-pass filters, and which generates a drive command to the power conversion unit by using the digital data output from the motor drive controlling digital low-pass filter.

4 Claims, 3 Drawing Sheets

(56) References Cited

U.S. PATENT DOCUMENTS

| | | |
|---|---|---|
| 2004/0177293 A1 | 9/2004 | Ricca et al. |
| 2004/0227485 A1 | 11/2004 | Matsubara et al. |
| 2009/0072773 A1* | 3/2009 | Kurosawa et al. ....... 318/400.04 |
| 2010/0201299 A1 | 8/2010 | Emde et al. |

FOREIGN PATENT DOCUMENTS

| | | | |
|---|---|---|---|
| JP | 3348036 A | | 11/2002 |
| JP | 2004072807 A | | 3/2004 |
| JP | 2008005596 A | | 1/2008 |
| JP | 2008099350 A | | 4/2008 |
| JP | 2008118750 A | * | 5/2008 |
| JP | 2008-147809 A | | 6/2008 |
| JP | 2010263727 A | | 11/2010 |
| WO | 9849775 A1 | | 11/1998 |

OTHER PUBLICATIONS

Office Action dated Feb. 6, 2014, corresponds to German patent application No. 102013006747.2.

* cited by examiner

MOTOR CONTROL APPARATUS EQUIPPED WITH DELTA-SIGMA MODULATION AD CONVERTER

RELATED APPLICATIONS

The present application is based on, and claims priority from, Japanese Application Number 2012-095530, filed Apr. 19, 2012, the disclosure of which is hereby incorporated by reference herein in its entirety.

BACKGROUND OF THE INVENTION

1. Field of the Invention

The present invention relates to a motor control apparatus equipped with a delta-sigma modulation AD converter, and more specifically to a motor control apparatus equipped with a delta-sigma modulation AD converter that is used to detect current flowing in each winding of a motor.

2. Description of the Related Art

A motor control apparatus for driving motors used in a machine tool, a forging press, an injection molding machine, an industrial robot, or the like, commands motor speed, torque, or rotor position in order to control the operation of each of the motors provided one for each drive axis. In such a motor control apparatus, the current flowing in each winding of the motor is detected and AD (analog-digital) converted into digital data which is used to control the driving of the motor as well as to detect any abnormal current flow that may occur in the motor.

FIG. 3 is a block diagram showing a conventional motor control apparatus. Generally, the motor control apparatus 101 which drives and controls a three-phase AC motor 2 includes a power conversion unit 51 which supplies drive power to the motor 2, a current detection unit 52 which detects the value of the current flowing from the power conversion unit 51 to each winding of the motor 2, a delta-sigma modulation AD (analog-digital) converter 53 which converts the value of the current detected by the current detection unit 52 into digital data, and a command generating unit 54 which generates, using the digital data supplied from the delta-sigma modulation AD converter 53, a drive command for commanding the power conversion unit 51 to output the drive power for driving the motor 2. The power conversion unit 51 is, for example, an inverter circuit and/or a converter circuit. The current detection unit 52 actually comprises two current detection units one for each of two of the three phase windings of the three-phase AC motor. In the thus configured motor control apparatus 101, the command generating unit 54 generates the drive command based on the digital data acquired by AD-converting the current flowing in each winding of the motor 2. Further, in the motor control apparatus 101, the digital data acquired by AD-converting the current flowing in each winding of the motor 2 is also used to monitor any abnormal current flow that may occur in each winding of the motor 2.

In recent years, the delta-sigma modulation AD conversion scheme described above has come to be widely employed in motor control apparatus. FIG. 4 is a block diagram showing a conventional delta-sigma modulation AD converter. The delta-sigma modulation AD converter 53 comprises two major sections, i.e., a modulator (delta-sigma modulation circuit) 61 and a digital low-pass filter 62, both of which operate on a system clock called a modulation clock whose frequency is generally about several to several tens of megahertz. The modulator 61 converts the input analog data into a high-speed low-bit bitstream signal. A large amount of quantization noise generated is removed by the digital low-pass filter 62, and the resulting data is output as the digital data. Generally, the digital data from the delta-sigma modulation AD converter 53 is output at a rate reduced by thinning the modulation clock by a predetermined factor. This factor is generally called the decimation ratio.

The delta-sigma modulation AD converter 53 in the motor control apparatus 101 is required to convert the value of the drive current flowing in each winding of the motor 2 into digital data with high resolution and high accuracy in order to control the speed, torque, or rotor position of the motor 2 with high accuracy. In the motor control apparatus 101 shown in FIG. 3, the command generating unit 54 acquires at a constant control rate the digital data that the delta-sigma modulation AD converter 53 outputs by AD-converting the value of the current flowing in each winding of the motor 2, and uses the acquired digital data to control the current. To acquire the digital data with high resolution and high accuracy, the sampling period of the delta-sigma modulation AD converter 53 is generally set to several tens to several hundreds of microseconds.

On the other hand, the motor control apparatus 101 is equipped with a protection circuit for detecting an abnormal current flow when an abnormal excessive current flows in any one of the windings of the motor 2, and for protecting the motor 2 and the motor control apparatus 101 against the abnormal current. Since such an abnormal current needs to be detected quickly, it is necessary for the delta-sigma modulation AD converter 53 in the motor control apparatus 101 to convert the value of the drive current flowing in each winding of the motor 2 into digital data as fast as possible. For example, in order to quickly detect abnormal current flow, it is generally necessary that the sampling period of the delta-sigma modulation AD converter 53 be several microseconds or shorter, but it is not necessarily required that the digital data obtained as the result of the AD conversion be high-resolution and high-accuracy data.

For a motor control apparatus that controls a motor by using a delta-sigma modulation AD converter for converting the current value detected on each winding of the motor into digital data, several proposals have been made in the prior art to enhance the current detection accuracy, including the one disclosed in Japanese Unexamined Patent Publication No. 2008-147809. According to the invention disclosed in Japanese Unexamined Patent Publication No. 2008-147809, the current detection accuracy is enhanced by additionally providing a PLL circuit in order to enhance the accuracy of the modulation clock in the modulator section provided in the first stage of the delta-sigma modulation AD converter.

On the other hand, according to the invention disclosed in Japanese Patent No. 3348036, a delta-sigma modulation DA (digital-analog) converter that can accomplish high-fidelity power amplification has been proposed.

As described above, in the motor control apparatus, the processing speed (response speed) and resolution required of the delta-sigma modulation AD converter for AD-converting the value of the current flowing in each winding of the motor differs between the motor control function and the motor protection function. To address this situation, the prior art employs a method that provides a plurality of delta-sigma modulation AD converters one for each specific function, or a method that uses the digital data output from a single delta-sigma modulation AD converter for both the motor control function and the motor protection function. However, the method that uses a plurality of delta-sigma modulation AD converters has had the problem that the mounting area in the motor control apparatus and the cost of the apparatus increase, while the method that uses the digital data output of a single delta-sigma modulation AD converter for both functions has the problem that the motor drive control accuracy and the abnormal current detection accuracy both degrade, because the processing speed (response speed) and resolution of the AD conversion are not optimized for each specific function.

For example, the invention disclosed in Japanese Unexamined Patent Publication No. 2008-147809 merely provides a single digital data output by using a single delta-sigma modulation AD converter, and it cannot be said that the processing speed (response speed) and resolution of the AD conversion are optimized for each specific function; hence, this prior art has involved the problem that the motor drive control accuracy and the abnormal current detection accuracy both degrade.

On the other hand, the invention disclosed in Japanese Patent No. 3348036 is intended for audio equipment and is not applicable to motor control apparatus. Furthermore, since this prior art is intended for a DC converter for converting digital data into an analog signal, it does not provide any solution when converting the current value flowing in a motor into digital data.

SUMMARY OF THE INVENTION

In view of the above problem, it is an object of the present invention to provide a motor control apparatus equipped with a small-size and low-cost delta-sigma modulation AD converter optimized for each specific purpose.

To attain the above object, according to the invention, a motor control apparatus comprising: a power conversion unit which supplies drive power to a motor; a current detection unit which detects the value of a current flowing from the power conversion unit to the motor; a delta-sigma modulation AD converter comprising a modulator, which outputs a bitstream signal by delta-sigma modulating input analog data, and a plurality of digital low-pass filters, each having a unique filter characteristic, which are connected in parallel to each other and are connected in series to the modulator, and which output digital data by respectively filtering out quantization noise contained in the bitstream signal output from the modulator in accordance with the unique filter characteristics, wherein the current value detected by the current detection unit is input as the analog data, and the digital data filtered respectively with the unique filter characteristics are output; and a command generating unit which is connected to the digital low-pass filter to be used for motor drive control among the plurality of digital low-pass filters, and which generates, using the digital data output from the motor drive controlling digital low-pass filter, a drive command for commanding the power conversion unit to output commanded drive power is provided.

The digital low-pass filters are set to have different filter characteristics by adjusting at least one parameter selected between filter order and decimation ratio.

The motor control apparatus may further include an abnormal current detection unit which is connected to the digital low-pass filter to be used for abnormal current detection among the plurality of digital low-pass filters, the abnormal current detecting digital low-pass filter being different from the motor drive controlling digital low-pass filter, and which, based on the digital data output from the abnormal current detecting digital low-pass filter, detects occurrence of an abnormal current flowing from the power conversion unit to the motor.

In this case, the motor drive controlling digital low-pass filter and the abnormal current detecting digital low-pass filter are set to have filter characteristics such that the motor drive controlling digital low-pass filter provides at least either a higher resolution or a higher accuracy than the abnormal current detecting digital low-pass filter.

Further, the motor drive controlling digital low-pass filter and the abnormal current detecting digital low-pass filter are set to have filter characteristics such that the abnormal current detecting digital low-pass filter performs filtering on the bitstream signal at a higher speed than the motor drive controlling digital low-pass filter.

The command generating unit may be configured to generate a stop command for commanding the power conversion unit to stop supplying the drive power when the occurrence of an abnormal current flow is detected by the abnormal current detection unit.

BRIEF DESCRIPTION OF THE DRAWINGS

The present invention will be more clearly understood with reference to the following accompanying drawings.

DETAILED DESCRIPTION

A motor control apparatus equipped with a delta-sigma modulation AD converter will be described below with reference to the drawings. It should, however, be understood that the present invention is not limited to the drawings, nor is it limited to any particular embodiment described herein.

Figure 1:
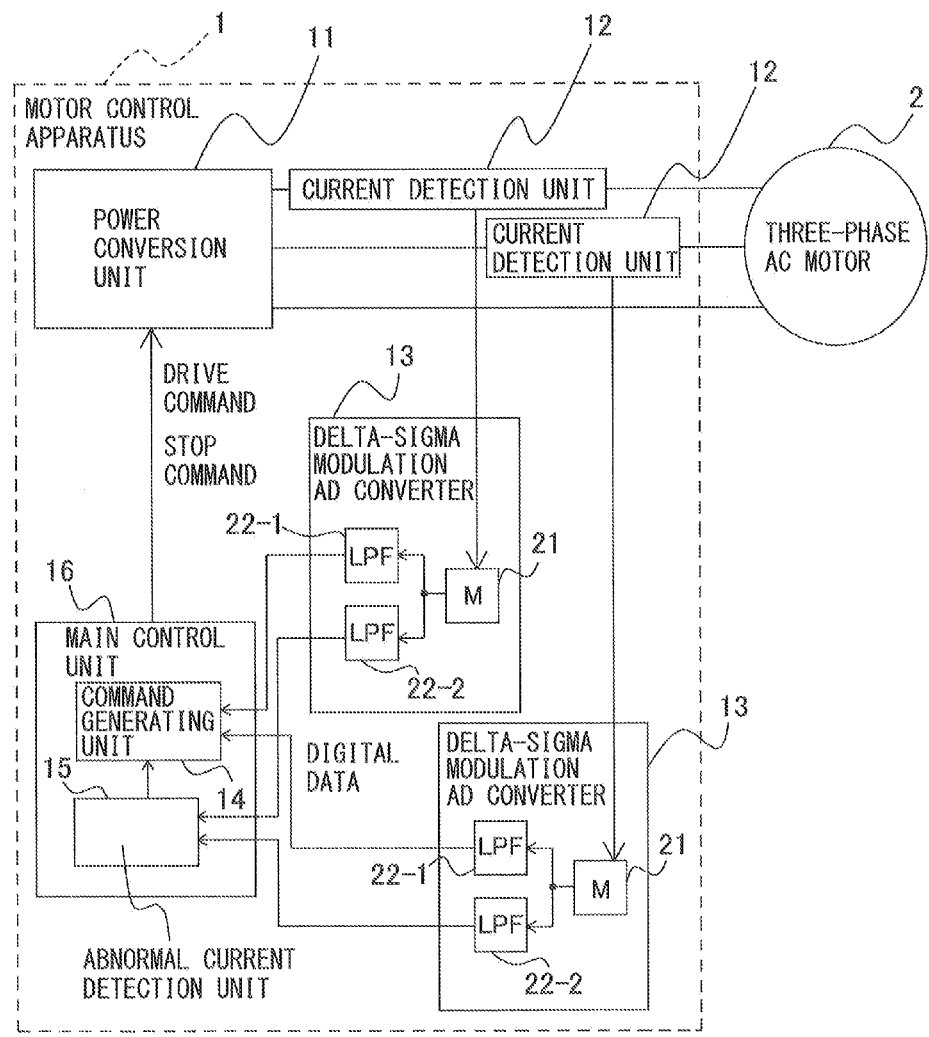
FIG. 1 is a block diagram showing a motor control apparatus equipped with a delta-sigma modulation AD converter according to an embodiment of the present invention.
Figure 2:
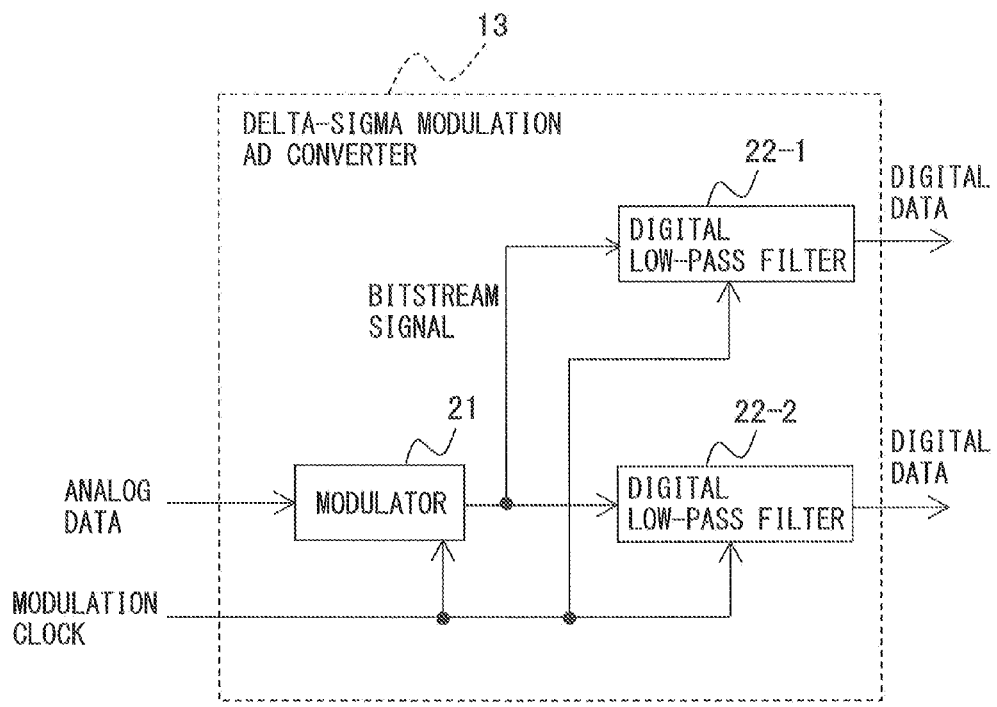
FIG. 2 is a block diagram showing the delta-sigma modulation AD converter provided in the motor control apparatus according to the embodiment.
Figure 3:
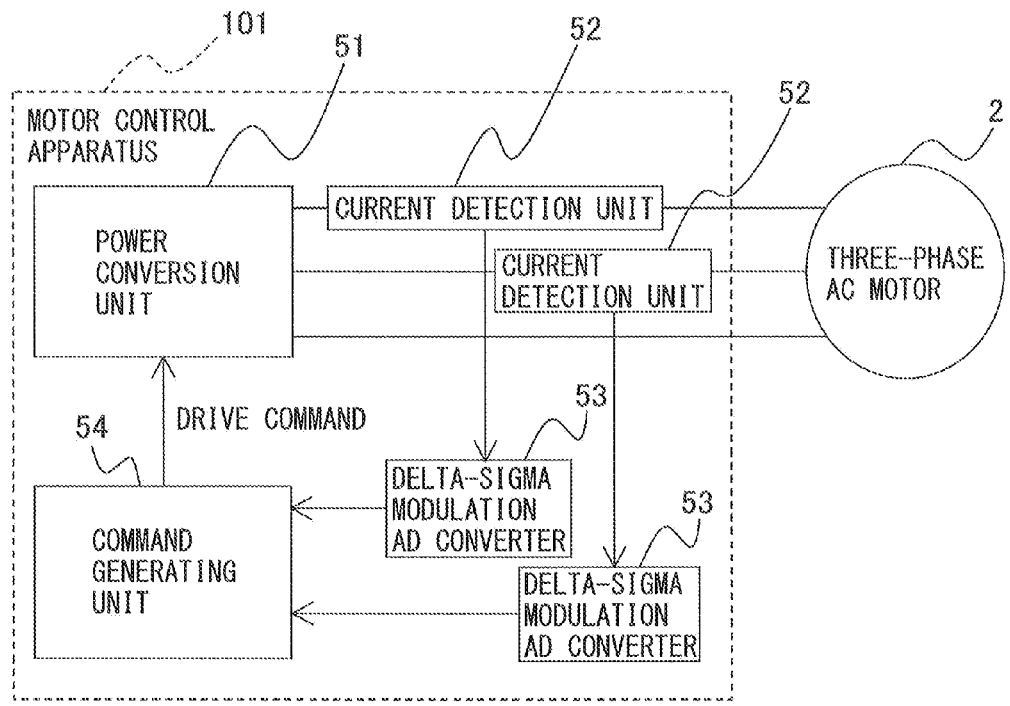
FIG. 3 is a block diagram showing a conventional motor control apparatus.
Figure 4:
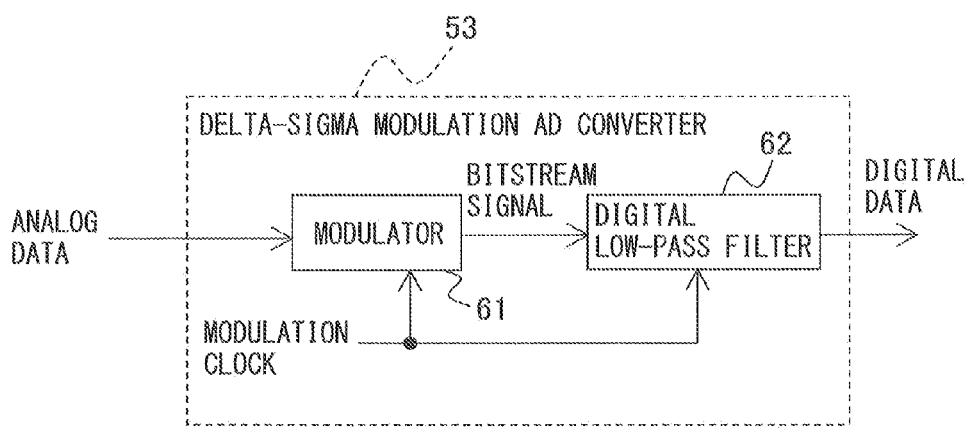
FIG. 4 is a block diagram showing a conventional delta-sigma modulation AD converter.

FIG. 1 is a block diagram showing a motor control apparatus equipped with a delta-sigma modulation AD converter according to an embodiment of the present invention. FIG. 2 is a block diagram showing the delta-sigma modulation AD converter provided in the motor control apparatus according to the embodiment.

According to the embodiment, the motor control apparatus 1 which drives and controls a three-phase AC motor 2 includes, as shown in FIG. 1, a power conversion unit 11, a current detection unit 12, a delta-sigma modulation AD converter 13, and a main control unit 16. The main control unit 16 includes a command generating unit 14 and an abnormal current detection unit 15. The delta-sigma modulation AD converter 13 in the motor control apparatus 1 includes a modulator (delta-sigma modulation circuit) 21 and a plurality of digital low-pass filters 22-1 and 22-2. The embodiment will be described for the case where the delta-sigma modulation AD converter 13 includes two digital low-pass filters, one for motor drive control and the other for abnormal current detection; while the number of digital low-pass filters is shown as two as an example, the number may be three or more, the only requirement being that the number is not less than two, and an additional digital low-pass filter may be provided for an additional purpose other than the motor drive control and abnormal current detection.

The power conversion unit 11 supplies drive power to the motor 2 in accordance with a drive command supplied from the command generating unit 14. For example, the power conversion unit 11 is constructed from a power converter that converts input power to desired output power with its internal switching device being switched on and off under PWM control. When the power conversion unit 11 shown in FIG. 1 is constructed from an inverter circuit, DC power is input to the power conversion unit 11 constructed from the inverter circuit, and the input power is converted to desired AC output power by the switching operation of the switching device provided in the power conversion unit 11. On the other hand, when the power conversion unit 11 shown in FIG. 1 is constructed, for example, from a converter circuit and inverter circuit connected together by a DC link unit, AC power is input to the power conversion unit 11 constructed from the converter circuit and inverter circuit, and the input power is first converted to DC power which is then converted to desired AC output power by the switching operations of the switching devices provided in the power conversion unit 11.

The current detection unit 12 detects the value of the current flowing from the power conversion unit 11 to the motor 2. The current detection unit 12, which actually comprises a plurality of current detection units, need only be provided for at least two of the three phase windings of the three-phase AC motor by considering the three-phase balance. The detected current value is supplied as an analog signal to the delta-sigma modulation AD converter 13.

The delta-sigma modulation AD converter 13 converts the value of the current (analog signal) detected by the current detection unit 52 into digital data by using a modulation clock as a system clock. The delta-sigma modulation AD converter 13 actually comprises a plurality of delta-sigma modulation AD converters, provided one for each of the current detection units 12. The modulator 21 and digital low-pass filters 22-1 and 22-2 provided in the delta-sigma modulation AD converter 13 operate on a system clock referred to as a modulation clock of about several to several tens of megahertz.

The delta-sigma modulation AD converter 13 includes the plurality of digital low-pass filters 22-1 and 22-2, as shown in FIG. 2, each of which outputs digital data by filtering out quantization noise contained in a bitstream signal output from the modulator 21. In the illustrated example, the number of digital low-pass filters is two as an example. The digital low-pass filters 22-1 and 22-2 are connected in parallel to each other. The paralleled digital low-pass filters 22-1 and 22-2 are connected in series to the modulator 21.

In the present invention, the paralleled digital low-pass filters 22-1 and 22-2 each have a unique filter characteristic. A structure generally called a SINC filter is well known for use as a digital low-pass filter. When each of the digital low-pass filters 22-1 and 22-2 is a SINC filter, the filter characteristics are defined, for example, by such parameters as filter order, decimation ratio, etc. Therefore, in the embodiment, the digital low-pass filters 22-1 and 22-2 provided in the delta-sigma modulation AD converter 13 are set to have different filter characteristics by adjusting at least one of the parameters, the filter order or the decimation ratio. Further, by enhancing the speed of the modulation clock, the response speed (filtering speed) of the digital low-pass filter 22-1 can be increased.

Since the digital low-pass filters 22-1 and 22-2 are set to have different filter characteristics, as described above, the digital low-pass filters 22-1 and 22-2 respectively output digital data of different resolutions and accuracies in accordance with their respective response speeds. That is, by using the same delta-sigma modulation AD converter 13, the digital data can be output with the response speed and resolution that matches each specific purpose.

In the example shown in FIGS. 1 and 2, the digital low-pass filter 22-1 in the delta-sigma modulation AD converter 13 is connected to the command generating unit 14 and used for motor drive control, and the digital data output from the digital low-pass filter 22-1 is used to create the drive command to the motor 2. On the other hand, the digital low-pass filter 22-2 in the delta-sigma modulation AD converter 13 is connected to the abnormal current detection unit 15 and used for abnormal current detection, and the digital data output from the digital low-pass filter 22-2 is used to detect the occurrence of an abnormal current flowing to the motor 2.

For example, in the motor control apparatus 1, the filter characteristics of the digital low-pass filters 22-1 and 22-2 are set so that the motor drive controlling digital low-pass filter 22-1 provides at least either a higher resolution or a higher accuracy than the abnormal current detecting digital low-pass filter 22-2 and so that the abnormal current detecting digital low-pass filter 22-2 filters at a higher speed than the motor drive controlling digital low-pass filter 22-1.

Generally, the motor control process is often performed by software processing in the command generating unit 14, and the digital low-pass filter 22-1 outputs high-resolution high-accuracy digital data, produced by filtering over a certain length of time, to the command generating unit 14 at a predetermined control rate. For example, digital data obtained by filtering a bitstream signal corresponding to a current value taken over a time interval of about 20 µs is output to the command generating unit 14.

On the other hand, the process for detecting the occurrence of an abnormal current flowing to the motor 2 is generally performed by hardware processing, since the process requires high-speed processing. That is, it is necessary to acquire digital data as fast as possible, though the resolution may be low. Therefore, the abnormal current detecting digital low-pass filter 22-2 is set so that the bitstream signal output from the modulator 21 is filtered through the digital low-pass filter 22-2 over a shorter time interval than the abnormal current detecting digital low-pass filter 22-2, thereby achieving a faster response speed. The digital data thus obtained is output to the abnormal current detection unit 15 which is implemented in hardware.

The power transistor such as an IGBT used as the semiconductor switching device in the power converter constituting the power conversion unit 11 may break down if a current exceeding the rated value continues to flow for more than a specified length of time. The time necessary for such a breakdown is generally about 10 µs. If the motor 2 and the motor control apparatus 1 are to be shut down within 10 µs after detecting the occurrence of an abnormal current flow, the filtering time interval of about 20 µs taken by the motor drive controlling digital low-pass filter 22-1 is far from satisfying the requirement. Therefore, the embodiment achieves fast response by setting the filtering time interval of the abnormal current detecting digital low-pass filter 22-2 shorter than the filtering time interval of the motor drive controlling digital low-pass filter 22-1. For example, compared with the motor drive controlling digital low-pass filter 22-1 that filters a bitstream signal corresponding to a current value taken over a time interval of about 20 µs, the filter characteristics of the abnormal current detecting digital low-pass filter 22-2 are set so that it filters a bitstream signal corresponding to a current value taken over a time interval of about 5 µs. By thus setting the filtering time interval shorter, the abnormal current detecting digital low-pass filter 22-2 can achieve faster filtering, i.e., faster digital data output, but the resolution drops. However, if the resolution of the digital data output by the abnormal current detecting digital low-pass filter 22-2 is low, this does not present any particular problem because it is more important to shut down the motor 2 and the motor control apparatus 1 as quickly as possible upon detection of an abnormal current flow.

As described above, according to the embodiment, the digital low-pass filters 22-1 and 22-2 connected in parallel to each other are placed directly after the modulator 21 provided in the same delta-sigma modulation AD converter 13. The digital low-pass filters 22-1 and 22-2 having different filter characteristics respectively filter the bitstream signal output from the modulator 21 with their respective filter characteristics, and supply the respectively obtained digital data to the command generating unit 14 and the abnormal current detection unit 15, respectively. In the main control unit 16 shown in FIG. 1, the command generating unit 14 and the abnormal current detection unit 15 respectively control the motor drive and abnormal current detection by using the respectively generated digital data.

The command generating unit 14 in the main control unit 16 is connected to the motor drive controlling digital low-pass filter 22-1 in the delta-sigma modulation AD converter 13. By using the high-resolution high-accuracy digital data that is output as described above from the motor drive controlling digital low-pass filter 22-1 in the delta-sigma modulation AD converter 13, the command generating unit 14 generates a drive command for commanding the power conversion unit 11 to output the commanded drive power. For example, when the power conversion unit 11 is constructed from a PWM control power converter, as earlier described, the command generating unit 14 compares a triangular carrier signal with the digital data output from the delta-sigma modulation AD converter 13 and, based on the result of the comparison, generates and outputs a PWM switching signal for controlling the switching operation of the switching device. Then, the power conversion unit 11 constructed from the power converter converts the input power to the desired output power with its internal switching device being switched on and off under PWM control based on the PWM switching signal supplied as the drive command from the command generating unit 14.

The abnormal current detection unit 15 in the main control unit 16 is connected to the abnormal current detecting digital low-pass filter 22-2 in the delta-sigma modulation AD converter 13. Based on the low-resolution digital data that is output at high speed as described above from the digital low-pass filter 22-2 in the delta-sigma modulation AD converter 13, the abnormal current detection unit 15 detects the occurrence of an abnormal current flowing from the power conversion unit 11 to the motor 2. When the occurrence of an abnormal current flow is detected by the abnormal current detection unit 15, the command generating unit 14 generates a stop command for commanding the power conversion unit 11 to stop supplying the drive power in order to stop the driving of the motor 2. For example, when the power conversion unit 11 is constructed from a PWM control power converter, as earlier described, a PWM switching signal that serves as the stop command is generated. Then, in the power conversion unit 11 constructed from the power converter, the switching operation of its internal semiconductor switching device is stopped in response to the PWM switching signal received as the stop command.

As described above, according to the embodiment, the operation of the motor 2 is controlled with high accuracy by acquiring the high-resolution high-accuracy digital data from the analog signal representing the current value detected by the current detection unit 12 and, at the same time, early detection of an abnormal current flow to the motor 2 is achieved by monitoring the low-resolution digital data generated at high speed.

Next, a design example of the delta-sigma modulation AD converter will be described.

Generally, in the delta-sigma modulation AD converter, the modulator section requires a high-accuracy analog signal processing technique, but the digital low-pass filter section can be implemented with a relatively simple logic circuit and can therefore be designed as desired at the user side. As a result, often the user designs the digital low-pass filter section at his discretion while constructing the preceding modulator section by using the IC provided by the vendor. In particular, in the field of motor control apparatuses, the user often develops a customized LSI in order to implement logic circuits, for example, for triangular wave comparison PWM switching control. In this case, if the logic circuit of the digital low-pass filter is implemented as part of the custom LSI, the increase in mounting area and cost can be suppressed.

In view of this, in the embodiment also, if the digital low-pass filter section constructed from a plurality of paralleled filters that follows the modulator section is implemented, for example, as part of logic in the custom LSI, the increase in mounting area and cost can be suppressed. If the digital low-pass filter section is implemented in logic circuitry, there is no need to add a physical component to implement the digital low-pass filter.

While the power conversion unit 11 used in the motor control apparatus 1 has been described by taking as an example the inverter circuit that drives and controls the motor 2, the present invention is also applicable for detecting the current on the AC side of a converter circuit that converts AC power to DC power. For example, when the converter circuit is constructed as a PWM converter that uses a semiconductor switching device, there is a need to detect the current on the AC side of the converter circuit and to use the detected current value for PWM control, and the present invention can also be applied for the AD conversion of the current value in such cases.

The present invention can be applied to any motor control apparatus that detects the current flowing in each winding of a motor and that uses the detected current value for controlling the driving of the motor. For example, in the case of a motor control apparatus for driving motors used in a machine tool, a forging press, an injection molding machine, an industrial robot, or the like, the apparatus commands motor speed, torque, or rotor position command in order to control the operation of each of the motors provided one for each drive axis. In such a motor control apparatus, it is important to detect the current flowing in each winding of the motor and to perform the motor drive control and abnormal current detection with high accuracy, and the present invention can also be applied in such cases.

According to the present invention, it is possible to achieve a motor control apparatus equipped with a small-size and low-cost delta-sigma modulation AD converter optimized for each specific purpose.

The delta-sigma modulation AD converter includes a modulator that outputs a bitstream signal by delta-sigma modulating an input analog signal, and a plurality of paralleled digital low-pass filters, provided directly after the modulator, that respectively output digital data by filtering out quantization noise contained in the bitstream signal output from the modulator; since the digital low-pass filters are set to have different filter characteristics, and perform filtering with their respective filter characteristics, digital data having different response speeds and resolutions for different purposes can be output by using the single delta-sigma modulation AD converter. Therefore, compared with the prior art method that outputs digital data for different purposes by using a plurality of delta-sigma modulation AD converters, the mounting area of the delta-sigma modulation AD converter and the cost of the motor control apparatus can be reduced, and thus the invention can reduce the size and cost of the motor control apparatus. Furthermore, compared with the prior art method that uses the digital data output from a single delta-sigma modulation AD converter for more than one purpose, the motor control and abnormal current detection accuracy can be further enhanced, because the processing speed (response speed) and resolution of the AD conversion can be optimized for each specific purpose.

For example, in the motor control apparatus, by setting the filter characteristics of the digital low-pass filters 22 so that the motor drive controlling digital low-pass filter connected to the command generating unit provides at least either a higher resolution or a higher accuracy than the abnormal current detecting digital low-pass filter connected to the abnormal current detection unit and so that the abnormal current detecting digital low-pass filter performs filtering at a higher speed than the motor drive controlling digital low-pass filter, not only can the motor speed, torque, or rotor position be controlled with high accuracy, but if an abnormal excessive current flows in any winding of the motor, such an abnormal current flow can be detected quickly to protect the motor and the motor control apparatus against the abnormal current flow. The prior art has addressed this either by providing a plurality of delta-sigma modulation AD converters, one for the motor control function and the other for the motor protection function, or by using a single delta-sigma modulation AD converter for both the motor control function and the motor protection function; by contrast, according to the present invention, since provisions are made to be able to output the digital data of the resolution optimized for each specific purpose at the response speed optimized for each specific purpose by using a single delta-sigma modulation AD converter in which a plurality of paralleled digital low-pass filters having different filter characteristics are provided directly after the modulator, not only can the size and cost of the motor control apparatus equipped with such a delta-sigma modulation AD converter be reduced, but the motor drive control and abnormal current detection accuracy can be enhanced.

According to the invention disclosed in Japanese Unexamined Patent Publication No. 2008-147809, the detection accuracy can be enhanced, but according to the present invention, even when using the digital data after the AD conversion for different purposes, a plurality of digital data having different resolutions and different response speeds optimized for the respective purposes can be produced from one analog signal input, and thus the present invention can provide the digital data of the resolution, accuracy, and response speed optimized for each specific purpose.

On the other hand, the invention disclosed in Japanese Patent No. 3348036 is related to a delta-sigma DA converter that outputs one analog signal for one digital data input, and a plurality of filters are provided and selectively switched for use according to the type and condition of the digital data input. That is, the invention disclosed in Japanese Patent No. 3348036 is not one that concerns a delta-sigma AD converter for which the present invention is intended. In contrast, according to the present invention, the plurality of digital low-pass filters are not switched from one to the other, but output digital data according to their respective filter characteristics. That is, since the plurality of digital data having different resolutions and different response speeds optimized for the respective purposes can be produced from one analog signal input, the present invention can not only provide the digital data of the resolution, accuracy, and response speed optimized for each specific purpose but can also achieve reductions in the size and cost of the apparatus.

What is claimed is:

1. A motor control apparatus, comprising:
a power conversion unit which supplies drive power to a motor;
a current detection unit which detects the value of a current flowing from said power conversion unit to said motor;
a delta-sigma modulation AD converter comprising a modulator, which outputs a bitstream signal by delta-sigma modulating input analog data, and a plurality of digital low-pass filters, each having different filter characteristics by adjusting at least one parameter selected between filter order and decimation ratio, which are connected in parallel to each other and are connected in series to said modulator, and which output digital data by respectively filtering out quantization noise contained in said bitstream signal output from said modulator in accordance with said unique filter characteristics, wherein said current value detected by said current detection unit is input as said analog data, and said digital data filtered respectively with said unique filter characteristics are output;
a command generating unit which is connected to said digital low-pass filter to be used for motor drive control among said plurality of digital low-pass filters, and which generates, using said digital data output from said motor drive controlling digital low-pass filter, a drive command for commanding said power conversion unit to output commanded drive power; and
an abnormal current detection unit which is connected to said digital low-pass filter to be used for abnormal current detection among said plurality of digital low-pass filters, said abnormal current detecting digital low-pass filter being different from said motor drive controlling digital low-pass filter, and which, based on said digital data output from said abnormal current detecting digital low-pass filter, detects occurrence of an abnormal current flowing from said power conversion unit to said motor,
wherein said motor drive controlling digital low-pass filter and said abnormal current detecting digital low-pass filter are set to have filter characteristics such that said motor drive controlling digital low-pass filter provides at least either a higher resolution or a higher accuracy than said abnormal current detecting digital low-pass filter.

2. A motor control apparatus, comprising:
a power conversion unit which supplies drive power to a motor;
a current detection unit which detects the value of a current flowing from said power conversion unit to said motor;
a delta-sigma modulation AD converter comprising a modulator, which outputs a bitstream signal by delta-sigma modulating input analog data, and a plurality of digital low-pass filters, each having different filter characteristics by adjusting at least one parameter selected between filter order and decimation ratio, which are connected in parallel to each other and are connected in series to said modulator, and which output digital data by respectively filtering out quantization noise contained in said bitstream signal output from said modulator in accordance with said unique filter characteristics, wherein said current value detected by said current detection unit is input as said analog data, and said digital data filtered respectively with said unique filter characteristics are output;

a command generating unit which is connected to said digital low-pass filter to be used for motor drive control among said plurality of digital low-pass filters, and which generates, using said digital data output from said motor drive controlling digital low-pass filter, a drive command for commanding said power conversion unit to output commanded drive power; and an abnormal current detection unit which is connected to said digital low-pass filter to be used for abnormal current detection among said plurality of digital low-pass filters, said abnormal current detecting digital low-pass filter being different from said motor drive controlling digital low-pass filter, and which, based on said digital data output from said abnormal current detecting digital low-pass filter, detects occurrence of an abnormal current flowing from said power conversion unit to said motor, wherein said motor drive controlling digital low-pass filter and said abnormal current detecting digital low-pass filter are set to have filter characteristics such that said abnormal current detecting digital low-pass filter performs filtering on said bitstream signal at a higher speed than said motor drive controlling digital low-pass filter.

3. The motor control apparatus according to claim 1, wherein when the occurrence of an abnormal current flow is detected by said abnormal current detection unit, said command generating unit generates a stop command for commanding said power conversion unit to stop supplying said drive power.

4. The motor control apparatus according to claim 2, wherein when the occurrence of an abnormal current flow is detected by said abnormal current detection unit, said command generating unit generates a stop command for commanding said power conversion unit to stop supplying said drive power.

* * * * *